(12) United States Patent
Kubach et al.

(10) Patent No.: US 10,978,938 B2
(45) Date of Patent: Apr. 13, 2021

(54) CONTROLLED LOAD DEVICE AND MANUFACTURING METHOD FOR A CONTROLLED LOAD DEVICE

(71) Applicant: Robert Bosch GmbH, Stuttgart (DE)

(72) Inventors: Michael Kubach, Ludwigsburg (DE); Jochen Huebl, Schwieberdingen (DE); Peter Kralicek, Marbach (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/618,843

(22) PCT Filed: Apr. 19, 2018

(86) PCT No.: PCT/EP2018/059996
§ 371 (c)(1),
(2) Date: Dec. 3, 2019

(87) PCT Pub. No.: WO2018/224213
PCT Pub. Date: Dec. 13, 2018

(65) Prior Publication Data
US 2020/0136475 A1    Apr. 30, 2020

(30) Foreign Application Priority Data
Jun. 9, 2017   (DE) .................... 10 2017 209 742.6

(51) Int. Cl.
*H02K 11/20*   (2016.01)
*H02P 6/10*    (2006.01)
(Continued)

(52) U.S. Cl.
CPC ............. *H02K 11/20* (2016.01); *G01R 17/02* (2013.01); *H02P 6/10* (2013.01); *H04B 15/00* (2013.01); *B60L 2270/147* (2013.01)

(58) Field of Classification Search
CPC ... H02K 11/20; G01R 17/02; B60L 2270/147; H04B 15/00; H02P 6/10; H02P 1/00;
(Continued)

(56) References Cited

U.S. PATENT DOCUMENTS

2012/0306217 A1* 12/2012 Shoji ...................... H02K 11/02
                                                              290/38 R
2017/0045588 A1*  2/2017 Aoki ..................... G01R 31/389

FOREIGN PATENT DOCUMENTS

DE        9418804 U1    1/1995
DE     102004043103 A1  6/2005
(Continued)

OTHER PUBLICATIONS

International Search Report for PCT/EP2018/059996, dated Jul. 4, 2018.

*Primary Examiner* — Antony M Paul
(74) *Attorney, Agent, or Firm* — Norton Rose Fulbright US LLP; Gerard Messina

(57) ABSTRACT

A controlled load device including a load, a control electronics unit, which is connected via at least one conductor to the load in such a way that the load may be switched and/or energized via at least one electrical signal relayed via the at least one conductor, and at least one first electromechanical feedback component, which is designed for guiding or feeding back high-frequency interference signals from the load into the control electronics unit, the load connected via the at least one conductor to the control electronics unit having a load impedance including a load impedance minimum at a load impedance minimum frequency, and the first electromechanical feedback component having a first feedback impedance including a first feedback impedance minimum at a first feedback impedance minimum frequency
(Continued)

between 1% of the load impedance minimum frequency and 100% of the load impedance minimum frequency.

15 Claims, 2 Drawing Sheets

(51) Int. Cl.
*G01R 17/02* (2006.01)
*H04B 15/00* (2006.01)

(58) Field of Classification Search
CPC ...... H02P 1/04; H02P 1/08; H02P 1/10; H02P 1/12; H02P 1/16; H02P 1/163; H02P 1/166; H02P 1/124; H02P 1/126; H02P 1/28; H02P 1/30; H02P 1/34; H02P 1/42; H02P 1/426; H02P 1/46; H02P 1/445; H02P 7/288; H02P 3/00; H02P 6/00; H02P 23/00; H02P 25/00; H02P 27/00; H02P 27/04; H02P 27/06; H02P 25/03; H02P 25/24; H02P 23/08
USPC .......... 318/400.01, 700, 701, 727, 805, 800, 318/801, 814, 821
See application file for complete search history.

(56) References Cited

FOREIGN PATENT DOCUMENTS

| | | |
|---|---|---|
| DE | 102012104454 A1 | 12/2012 |
| JP | H05290345 A | 11/1993 |
| JP | 2000207857 A | 7/2000 |
| JP | 2007113568 A | 5/2007 |

* cited by examiner

CONTROLLED LOAD DEVICE AND MANUFACTURING METHOD FOR A CONTROLLED LOAD DEVICE

FIELD

The present invention relates to a controlled load device. The present invention also relates to a manufacturing method for a controlled load device.

BACKGROUND INFORMATION

A current and data distribution system including a motor as a load is described in German Patent No. 10 2004 043 103 B4. The motor is connected to a control unit in such a way that alternating current may be provided to the motor via wires. Moreover, German Patent No. DE 10 2004 043 103 B4 provides an additional neutral wire for feeding back current signals.

SUMMARY

The present invention relates to a controlled load device and a manufacturing method for a controlled load device.

The present invention provides an impedance improvement of an electromechanical connection of the load to the control electronics unit formed, at a minimum, with the aid of the at least one conductor and the first electromechanical feedback component. This effectuates a significantly improved feedback of interference signals, in particular of high-frequency interference signals, from the load into the control electronics unit.

Due to the establishment according to the present invention of the first feedback impedance minimum frequency of the first electromechanical feedback component with respect to the load impedance minimum frequency of the load connected to the control electronics unit via the at least one conductor, the at least one conductor and the first electromechanical feedback component may interact with one another in such a way that a significant improvement is achieved in the feedback of the high-frequency interference signals. The high-frequency interference signals may thus be "returned" more effectively into the control electronics unit.

For example, the first electromechanical feedback component may include the first feedback impedance having the first feedback impedance minimum at the first feedback impedance minimum frequency between 10% of the load impedance minimum frequency and 100% of the load impedance minimum frequency, in particular between 20% of the load impedance minimum frequency and 100% of the load impedance minimum frequency, especially between 40% of the load impedance minimum frequency and 100% of the load impedance minimum frequency. The first feedback impedance minimum frequency may thus be "close" enough to the load impedance minimum frequency that the at least one conductor and the first electromechanical feedback component situated in parallel thereto ensure the desired interaction for the optimized feedback of interference signals.

The first feedback impedance minimum frequency of the first electromechanical feedback component is preferably established with the aid of a quality and/or a resonant frequency of the first electromechanical feedback component. Therefore, cost-effective components of the first electromechanical feedback component, for example, at least one resistor and/or at least one capacitor, may be used to establish the first feedback impedance minimum frequency of the first electromechanical feedback component.

In one advantageous specific embodiment of the present invention, the controlled load device includes a first feedback spring, a first feedback contact, and/or a first screw connection as the first electromechanical feedback component. Cost-effective components may thus be used as the first electromechanical feedback component.

As an advantageous refinement of the present invention, the controlled load device may also include, in addition to the first electromechanical feedback component, a second electromechanical feedback component, which is designed for guiding or feeding back the high-frequency interference signals from the load into the control electronics. The second electromechanical feedback component may also contribute to improving the feedback of the high-frequency interference signals.

In this case, a parallel circuit made of the load connected via the at least one conductor to the control electronics unit and the second electromechanical feedback component is advantageously provided, which includes a parallel circuit impedance maximum at a parallel circuit impedance maximum frequency. Measurements have shown that in this case the feedback of interference signals, in particular the feedback of high-frequency interference signals, is optimized.

The second electromechanical feedback component preferably includes a second feedback impedance having a second feedback impedance minimum at a second feedback impedance minimum frequency less than the load impedance minimum frequency, the second feedback impedance minimum frequency being less than 50% of the load impedance minimum frequency. The second feedback impedance minimum frequency of the second electromechanical feedback component may thus be selected relatively freely.

The controlled load device may also include a second feedback spring, a second feedback contact, and/or a second screw connection as the second electromechanical feedback component. The second electromechanical feedback component may thus also be formed relatively cost-effectively and comparatively simply.

The load may advantageously be a motor, a valve, a light-emitting unit, and/or an electronic device. The load may be installable or installed in and/or on a vehicle. In particular, the load may be an electric brake booster motor, a pump motor, or a braking system valve. The present invention described here is thus usable for a variety of different loads. However, it is to be noted that the possible designs for the load listed here are only to be interpreted as examples.

The above-described advantages are also ensured upon execution of a corresponding manufacturing method for a controlled load device. It is to be expressly noted that the manufacturing method is refinable according to the above-explained specific embodiments of the controlled load device.

BRIEF DESCRIPTION OF THE DRAWINGS

Further features and advantages of the present invention are explained hereafter on the basis of the figures.

DETAILED DESCRIPTION OF EXAMPLE EMBODIMENTS

Figure 1A:
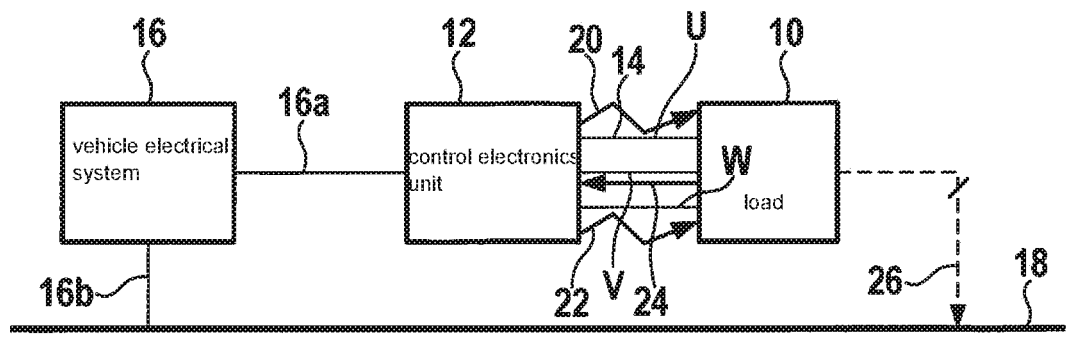
FIGS. 1a through 1d show schematic views and coordinate systems to explain one specific embodiment of the controlled load device.

FIGS. 1a through 1d show schematic views and coordinate systems to explain one specific embodiment of the controlled load device.

The controlled load device schematically shown with the aid of FIGS. 1a through 1d includes a load 10 and a control electronics unit 12, which is connected via at least one conductor 14 to load 10 in such a way that load 10 may be switched/is switched and/or may be energized/is energized via at least one electrical signal relayed via the at least one conductor 14. Control electronics unit 12 may also be referred to as a control unit and/or an activation circuit board. Solely by way of example, in the specific embodiment of FIGS. 1a through 1d, load 10 is designed as a motor 10, for example, as a brushless direct-current motor 10 (BLDC), in particular as a brushless three-phase motor 10. Motor 10 may especially be designed for a cyclic motor activation. By way of example, motor 10 is connected via three-phase lines U, V, and W (as the at least one conductor 14) to control electronics unit 12. However, an ability to design the controlled load device is not restricted to a specific load type or a special motor activation or to a specific design of the at least one conductor 14. Moreover, load 10 may also be a valve, a light-emitting unit (for example, a device having at least one light-emitting diode), and/or an electronic device, such as a domestic appliance, a material processing device (for example, an electric saw), and/or a high-performance device, in particular. It is also to be noted that the examples listed here for the design of the load 10 are only to be interpreted as examples.

By way of example, control electronics unit 12 is also connected in the example of FIGS. 1a through 1d to a vehicle electrical system 16. (Only a first line 16a and a second line 16b are outlined by way of example of lines 16a and 16b of vehicle electrical system 16 in FIG. 1a.) Moreover, components 10, 12, and 16 are internal-vehicle components 10, 12, and 16, only a chassis 18 being shown by way of example in FIG. 1a of the further vehicle components. As explained in greater detail hereafter, the controlled load device described hereafter is advantageously usable above all on/in a vehicle/motor vehicle. It is therefore advantageous if load 10 is installable/installed in/on a vehicle/motor vehicle. For example, the load may be an electric brake booster motor, a pump motor, or braking system valve. However, it is to be noted that a usability of the controlled load device is not limited to vehicles/motor vehicles.

Due to an activation and a design of load 10, (electromagnetic) emissions which may be referred to as interference signals are generated during its operation. For example, motor activation signals and/or a motor current of load 10 designed as motor 10 may be decoupled parasitically into its housing/motor housing. A reliable guide/feedback of the interference signals, in particular high-frequency interference signals, from load 10 (directly) into control electronics unit 12 is desirable.

Figure 1B:
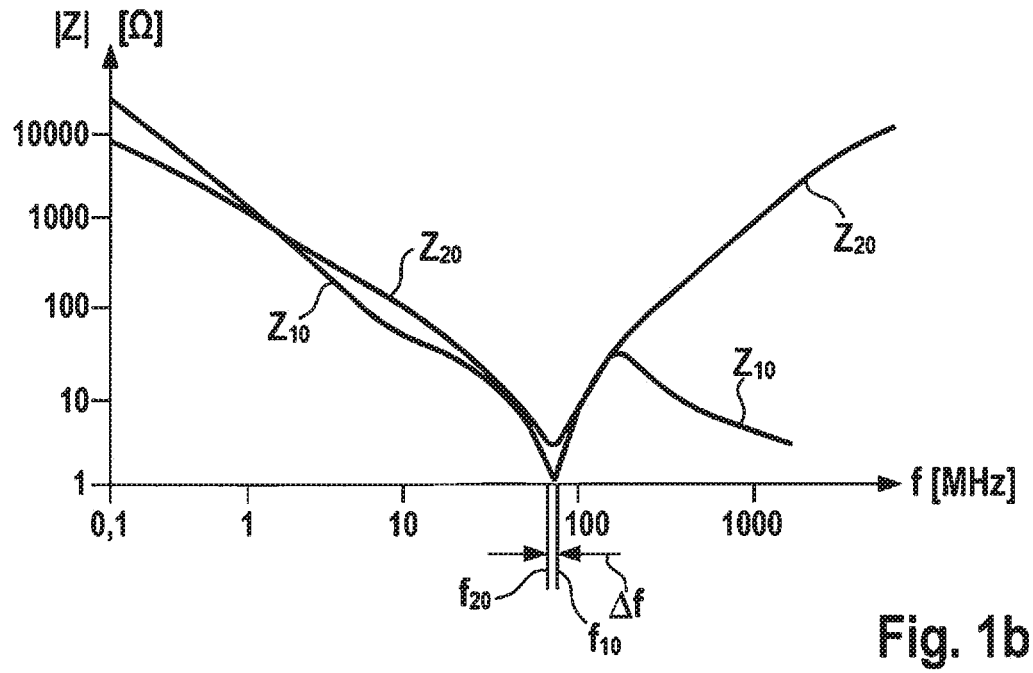

In the coordinate system of FIG. 1b, a (frequency-dependent) load impedance $Z_{10}$ of load 10 connected via the at least one conductor 14 to control electronics unit 12 is shown, an abscissa of the coordinate system showing frequencies f (in MHz/megahertz) and an ordinate of the coordinate system showing an impedance absolute value |Z| (in Ω/ohm). The physical variable "impedance" describes a property of a line or a medium during the electromechanical wave propagation. If load 10 is designed as motor 10, load impedance $Z_{10}$ of load 10 connected via the at least one conductor 14 to control electronics unit 12 may also be referred to as a motor impedance $Z_{10}$. An inductance of the at least one conductor 14 and/or a capacitance of a motor winding of load 10, for example, are significant variables for load impedance $Z_{10}$ of load 10 connected via the at least one conductor 14 to control electronics unit 12.

As is apparent in FIG. 1b, load impedance $Z_{10}$ of load 10 connected via the at least one conductor 14 to control electronics unit 12 includes a load impedance minimum at a load impedance minimum frequency $f_{10}$. Load impedance minimum frequency $f_{10}$ is design-related. Load impedance minimum frequency $f_{10}$ is frequently between 5 MHz (megahertz) and 300 MHz (megahertz), often between 70 MHz (megahertz) and 200 MHz (megahertz), sometimes between 80 MHz (megahertz) and 150 MHz (megahertz), for example, between 80 MHz (megahertz) and 100 MHz (megahertz). Load impedance minimum frequency $f_{10}$ is thus in a frequency range in which the guiding/feeding back of the high-frequency interference signals from load 10 into control electronics unit 12 is desired above all.

A first electromechanical feedback component 20 is therefore also formed on the controlled load device, which is designed for guiding or feeding back high-frequency interference signals from load 10 into control electronics unit 12. First electromechanical feedback component 20 preferably extends between load 10 and control electronics unit 12 in such a way that load 10 is also connected via first electromechanical feedback component 20 to control electronics unit 12. This may also be described as first electromechanical feedback component 20 being situated/formed in parallel to the at least one conductor 14. (However, first electromechanical feedback component 20 is not to be understood as being a conductive component for relaying an electrical signal used for controlling, switching, and/or energizing load 10 from control electronics unit 12 to load 10.) First electromechanical feedback component 20 enables an additional connection of load 10 to control electronics unit 12, which contributes to increasing the guiding/feeding back of interference signals, in particular high-frequency interference signals, from load 10 into control electronics unit 12.

A (frequency-dependent) first feedback impedance $Z_{20}$ of first electromechanical feedback component 20 is also shown in the coordinate system of FIG. 1b. It is apparent that first feedback impedance $Z_{20}$ of first electromechanical feedback component 20 has a first feedback impedance minimum at a first feedback impedance minimum frequency $f_{20}$ between 1% of load impedance minimum frequency $f_{10}$ and 100% of load impedance minimum frequency $f_{10}$. (A frequency difference Δf between load impedance minimum frequency $f_{10}$ and first feedback impedance minimum frequency $f_{20}$ is also shown.) While load 10 with the at least one conductor 14 thus represents a first "resonant circuit"/a first "resonant system" having load impedance minimum frequency $f_{10}$, first electromechanical feedback component 20 may be referred to as a second "resonant circuit"/a second "resonant system" having first feedback impedance minimum frequency $f_{20}$, which is coupled due to comparatively small frequency difference Δf between load impedance minimum frequency $f_{10}$ and first feedback impedance minimum frequency $f_{20}$ to the first "resonant circuit"/first "resonant system". Load 10 with the at least one conductor 14 and first electromechanical feedback component 20 may therefore be described as two "resonant circuits"/"resonant systems" coupled to one another (or as an "overall resonant circuit"/"overall resonant system"). High-frequency interference signals may thus be fed back better into control electronics unit 12. First electromechanical feedback component 20 therefore enables a compensation connection, which intentionally remedies design-related disadvantages of the connection of load 10 to control electronics unit 12 via the at least one conductor 14.

Due to the improved feedback of the high-frequency interference signals from load 10 into control electronics unit 12, an introduction of the high-frequency interference signals into chassis 18 or a further vehicle component is (essentially) suppressed. Therefore, it is not/hardly a concern that the high-frequency interference signals will pass through a large loop through chassis 18 and vehicle electrical system 16 to control electronics unit 12.

A first feedback impedance minimum value (of approximately 3Ω (ohm)) of the first feedback impedance minimum of first feedback impedance $Z_{20}$ may be significantly greater than a load impedance minimum value (of approximately 1Ω (ohm)) of the load impedance minimum of load impedance $Z_{10}$. First feedback impedance minimum frequency $f_{20}$ is preferably between 10% of load impedance minimum frequency $f_{10}$ and 100% of load impedance minimum frequency $f_{10}$, in particular between 20% of load impedance minimum frequency $f_{10}$ and 100% of load impedance minimum frequency $f_{10}$, especially between 40% of load impedance minimum frequency $f_{10}$ and 100% of load impedance minimum frequency $f_{10}$. First feedback impedance minimum frequency $f_{20}$ of first electromechanical feedback component 20 may be/become established correspondingly in a simple manner and reliably with the aid of a quality and/or a resonant frequency of first electromechanical feedback component 20. For this purpose, at least one physical variable of at least one resistor and/or at least one capacitor of first electromechanical feedback component 20 may be/become established accordingly.

The controlled load device may comprise a first feedback spring, a first feedback contact, and/or a first screw connection as first electromechanical feedback component 20. First electromechanical feedback component 20 is therefore implementable relatively cost-effectively having its advantageous properties.

Moreover, the controlled load device of FIGS. 1a through 1d also includes (in addition to first electromechanical feedback component 20), a second electromechanical feedback component 22, which is designed for guiding or feeding back the high-frequency interference signal from load 10 into control electronics unit 12. Second electromechanical feedback component 22 also preferably extends between load 10 and control electronics unit 12 in such a way that load 10 is connected via second electromechanical feedback component 22 to control electronics unit 12. In this case, second electromechanical feedback component 22 is formed in parallel to the at least one conductor 14 and/or in parallel to first electromechanical feedback component 20. (However, second electromechanical feedback component 22 is not to be understood as a conductive component for relaying an electrical signal used for controlling, switching, and/or energizing load 10 from control electronics unit 12 to load 10.) Second electromechanical feedback component 22 may be, for example, a second feedback spring, a second feedback contact, and/or a second screw connection. Second electromechanical feedback component 22 may also be formed having a second feedback impedance $Z_{22}$ (not shown) (in particular having a second feedback impedance minimum at a second feedback impedance minimum frequency), in such a way that the guiding/feeding back of the high-frequency interference signals from load 10 into control electronics unit 12 is improved/increased. For example, for this purpose the second feedback impedance minimum frequency may be (established as) less than 50% of load impedance minimum frequency $f_{10}$, for example, less than 30% of load impedance minimum frequency $f_{10}$, in particular less than 10% of load impedance minimum frequency $f_{10}$, especially less than 1% of load impedance minimum frequency $f_{10}$. (In the example shown, the second feedback impedance minimum frequency is, for example, in the kilohertz range). It is to be noted that the second feedback impedance minimum is preferably not to be understood as a designed impedance minimum.

It is also to be noted that second electromechanical feedback component 22 is implementable regardless of a design of first electromechanical feedback component 20. A specific geometrical extension/formation of second electromechanical feedback component 22 is not required for improving the guiding/feeding back of the high-frequency interference signals from load 10 to control electronics unit 12 with the aid of first electromechanical feedback component 20. An inductance of second electromechanical feedback component 22 also hardly plays a role in the suppression effect effectuated with the aid of first electromechanical feedback component 20.

Figure 1C:
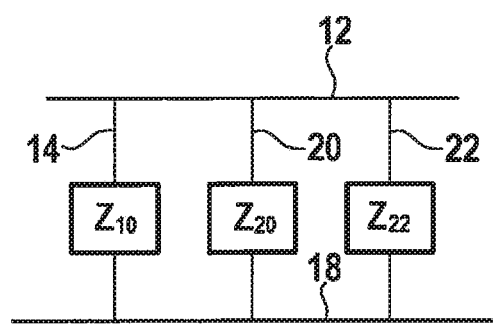

As schematically shown in FIG. 1c, the at least one conductor 14 forms a "path" in each case with load 10, first electromechanical feedback component 20, and second electromechanical feedback component 22 for interference signals/high-frequency interference signals between control electronics unit 12 and chassis 18, i.e., a total of three "paths". The three "paths" are connected in parallel to one another, as is schematically shown with the aid of the overall parallel circuit made up of the three paths of FIG. 1c.

Load 10 connected via the at least one conductor 14 to control electronics unit 12 and second electromechanical feedback component 22 form a "parallel circuit" having a parallel circuit impedance maximum at a parallel circuit impedance maximum frequency. Due to the superposition of their frequency responses, in this case the "parallel circuit" and first electromechanical feedback component 20 are coupled to one another and form the overall parallel circuit optimized with respect to the guiding/feeding back of interference signals (made of load 10 connected via the at least one conductor 14 to control electronics unit 12 and electromechanical feedback components 20 and 22) having a total impedance $Z_{total}$ having a total impedance minimum at a total impedance minimum frequency $f_{total}$ not equal to load impedance minimum frequency $f_{10}$.

Figure 1D:
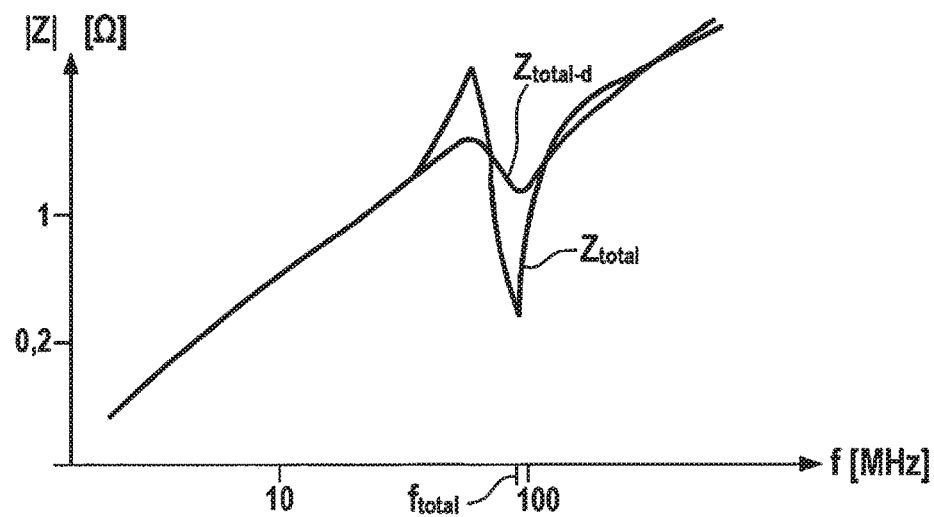

(Unattenuated) total impedance $Z_{total}$ and an attenuated total impedance $Z_{total-d}$ are shown in the coordinate system of FIG. 1d, an abscissa of the coordinate system showing frequencies f (in MHz/megahertz) and an ordinate of the coordinate system showing an impedance absolute value |Z| (in Ω/ohm). It is apparent that the "interconnection" results in total impedance $Z_{total}$ having a "new" maximum and a "new" minimum. The "interconnection" thus effectuates an improved feedback path for feeding back emissions of interferences/high-frequency interferences in the frequency range of load impedance minimum frequency $f_{10}$, as schematically shown with the aid of a (thick) arrow 24 in FIG. 1a. Moreover, a less strong formation of the "new" maximum and the "new" minimum may be effectuated by attenuated total impedance $Z_{total-d}$.

It is also to be noted here that the controlled load of FIGS. 1a and 1b (due to its design at least having first electromechanical feedback component 20) has an improved feedback in such a way that (essentially) no interference signals, in particular (almost) no high-frequency interference signals are dissipated to chassis 18 (or a corresponding ground connection). This is visually shown with the aid of a broken and struck-through arrow 26 in FIG. 1a. This advantage is ensured even in the case of fastening (not outlined in FIG. 1a) of load 10 on chassis 18, for example, fixedly screwing load 10 on chassis 18. The design at least having first electromechanical feedback component 20 is therefore particularly well suited for an electromechanical brake booster (generally fixedly screwed on chassis 18) as load 10.

Figure 2:
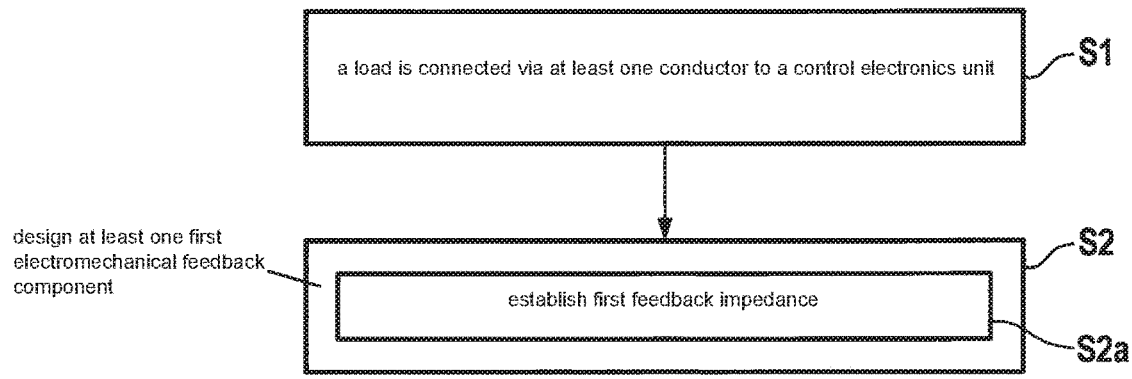
FIG. 2 shows a flow chart to explain one specific embodiment of the manufacturing method for a controlled load device.

FIG. 2 shows a flow chart to explain one specific embodiment of the manufacturing method for a controlled load device.

The manufacturing method described hereafter may be used, for example, to form the above-explained controlled load device. However, an ability to carry out the manufacturing method is not restricted to this specific embodiment of the controlled load device.

In a method step S1, a (later) load of the controlled load device is connected via at least one conductor to a (later) control electronics unit of the controlled load device in such a way that the load (during operation of the controlled load device) is/becomes switchable/switched and/or energizable/energized with the aid of at least one electrical signal relayed via the at least one conductor. During the operation of the controlled load device, the load connected via the at least one conductor to the control electronics unit thus has a load impedance having a load impedance minimum at a load impedance minimum frequency.

In a further method step S2, at least one first electromechanical feedback component is designed for guiding or feeding back high-frequency interference signals from the load into the control electronics unit. In a partial step S2a of method step S2, a first feedback impedance of the first electromechanical feedback component is established including a first feedback impedance minimum at a first feedback impedance minimum frequency between 1% of the load impedance minimum frequency ($f_{10}$) and 100% of the load impedance minimum frequency ($f_{10}$). The manufacturing method described here thus also contributes to better emission dissipation in a controlled load device manufactured thereby. By carrying out partial step S2a, the guiding/feeding back of the high-frequency interference signals from the load into the control electronics unit may be improved in such a way that decoupling of the high-frequency interferences into another component surrounding the load is (essentially) suppressed. If partial step S2a is carried out, a necessity for a design-related adaptation or overcoming of the load impedance minimum of the load impedance of the load is also dispensed with.

For example, in partial step S2a, the first feedback impedance minimum frequency of the first electromechanical feedback component may be established with the aid of a quality and/or a resonant frequency of the first electromechanical feedback component. To establish the impedance minimum of the first electromechanical feedback component, for example, at least one resistor and/or at least one capacitor of the first electromechanical feedback component may be used.

Optionally, the above-explained second electromechanical feedback component may also be formed in method step S2 (or in a further method step (not shown)). Method steps S1 and S2 may also be carried out in any arbitrary sequence, simultaneously, or at least chronologically overlapping.

What is claimed is:

1. A controlled load device, comprising:
   a load;
   a control electronics unit connected via at least one conductor to the load in such a way that the load is switched and/or energized via at least one electrical signal relayed via the at least one conductor, the load connected via the at least one conductor to the control electronics unit having a load impedance including a load impedance minimum at a load impedance minimum frequency; and
   at least one first electromechanical feedback component configured to guide or feeding back high-frequency interference signals from the load into the control electronics unit, wherein the first electromechanical feedback component has a first feedback impedance including a first feedback impedance minimum at a first feedback impedance minimum frequency between 1% of the load impedance minimum frequency and 100% of the load impedance minimum frequency.

2. The controlled load device as recited in claim 1, wherein the first electromechanical feedback component has the first feedback impedance including the first feedback impedance minimum at the first feedback impedance minimum frequency between 10% of the load impedance minimum frequency and 100% of the load impedance minimum frequency.

3. The controlled load device as recited in claim 2, wherein the first electromechanical feedback component has the first feedback impedance including the first feedback impedance minimum at the first feedback impedance minimum frequency between 20% of the load impedance minimum frequency and 100% of the load impedance minimum frequency.

4. The controlled load device as recited in claim 3, wherein the first electromechanical feedback component has the first feedback impedance including the first feedback impedance minimum at the first feedback impedance minimum frequency between 40% of the load impedance minimum frequency and 100% of the load impedance minimum frequency.

5. The controlled load device as recited in claim 1, wherein the first feedback impedance minimum frequency of the first electromechanical feedback component is established using a quality and/or a resonant frequency of the first electromechanical feedback component.

6. The controlled load device as recited in claim 1, wherein the controlled load device includes, as the first electromechanical feedback component, a first feedback spring, and/or a first feedback contact, and/or a first screw connection.

7. The controlled load device as recited in claim 1, wherein the controlled load device also includes, in addition to the first electromechanical feedback component, a second electromechanical feedback component, which is configured to guide or feeding back the high-frequency interference signals from the load into the control electronics unit.

8. The controlled load device as recited in claim 7, wherein a parallel circuit made up of the load connected via the at least one conductor to the control electronics unit and the second electromechanical feedback component includes a parallel circuit impedance maximum at a parallel circuit impedance maximum frequency.

9. The controlled load device as recited in claim 7, wherein the second electromechanical feedback component has a second feedback impedance including a second feedback impedance minimum at a second feedback impedance minimum frequency less than the load impedance minimum frequency, and the second feedback impedance minimum frequency is less than 50% of the load impedance minimum frequency.

10. The controlled load device as recited in claim 7, wherein the controlled load device includes, as the second electromechanical feedback component, a second feedback spring, and/or a second feedback contact, and/or a second screw connection.

11. The controlled load device as recited in claim 1, wherein the load is a motor, and/or a valve, and/or a light-emitting unit, and/or an electronic device.

12. The controlled load device as recited in claim 1, wherein the load is installable or installed in and/or on a vehicle.

13. The controlled load device as recited in claim 12, wherein the load is an electric brake booster motor, and/or a pump motor, and/or or a braking system valve.

14. A manufacturing method for a controlled load device, comprising the following steps:
  connecting a load of the controlled load device via at least one conductor to a control electronics unit of the controlled load device in such a way that the load is switched and/or energized using at least one electrical signal relayed via the at least one conductor, the load connected via the at least one conductor to the control electronics unit having a load impedance including a load impedance minimum at a load impedance minimum frequency;
  providing at least one first electromechanical feedback component configured to guide or feeding back high-frequency interference signals from the load into the control electronics unit; and
  establishing a first feedback impedance of the first electromechanical feedback component including a first feedback impedance minimum at a first feedback impedance minimum frequency between 1% of the load impedance minimum frequency and 100% of the load impedance minimum frequency.

15. The manufacturing method as recited in claim 14, wherein the first feedback impedance minimum frequency of the first electromechanical feedback component is established using a quality and/or a resonant frequency of the first electromechanical feedback component.

* * * * *